(12) United States Patent
Kwon

(10) Patent No.: US 9,317,051 B2
(45) Date of Patent: Apr. 19, 2016

(54) INTERNAL VOLTAGE GENERATION CIRCUITS

(71) Applicant: SK hynix Inc., Icheon-si Gyeonggi-do (KR)

(72) Inventor: Ig Soo Kwon, San Ramon, CA (US)

(73) Assignee: SK hynix Inc., Icheon-si Gyeonggi-do (KR)

(*) Notice: Subject to any disclaimer, the term of this patent is extended or adjusted under 35 U.S.C. 154(b) by 115 days.

(21) Appl. No.: 14/174,046

(22) Filed: Feb. 6, 2014

(65) Prior Publication Data

US 2015/0220092 A1 Aug. 6, 2015

(51) Int. Cl.
*G05F 1/46* (2006.01)
*G11C 5/14* (2006.01)
*G11C 7/20* (2006.01)

(52) U.S. Cl.
CPC ............... *G05F 1/465* (2013.01); *G11C 5/147* (2013.01); *G11C 7/20* (2013.01)

(58) Field of Classification Search
None
See application file for complete search history.

(56) References Cited

U.S. PATENT DOCUMENTS

| | | | | |
|---|---|---|---|---|
| 5,121,007 A * | 6/1992 | Aizaki | | 327/544 |
| 5,249,155 A * | 9/1993 | Arimoto et al. | | 365/222 |
| 5,321,653 A * | 6/1994 | Suh et al. | | 365/189.09 |
| 5,349,559 A * | 9/1994 | Park et al. | | 365/201 |
| 5,689,460 A * | 11/1997 | Ooishi | | 365/189.07 |
| 5,986,959 A * | 11/1999 | Itou | | 365/226 |
| 6,184,744 B1 * | 2/2001 | Morishita | | 327/541 |
| 6,310,511 B1 * | 10/2001 | Weinfurtner | | 327/540 |
| 6,373,754 B1 * | 4/2002 | Bae et al. | | 365/189.09 |
| 6,452,854 B1 * | 9/2002 | Kato et al. | | 365/226 |
| 6,954,103 B2 * | 10/2005 | Yamauchi et al. | | 327/540 |
| 6,998,903 B2 * | 2/2006 | Jin | | 327/541 |
| 7,049,881 B2 * | 5/2006 | Moon et al. | | 327/541 |
| 7,298,200 B2 * | 11/2007 | Won | | 327/541 |
| 7,307,469 B2 * | 12/2007 | Yamada et al. | | 327/540 |
| 7,315,198 B2 * | 1/2008 | Park et al. | | 327/541 |
| 7,432,758 B2 * | 10/2008 | Chou et al. | | 327/540 |
| 7,436,314 B2 * | 10/2008 | Haider et al. | | 340/661 |
| 7,577,043 B2 * | 8/2009 | Chou et al. | | 365/189.09 |
| 7,733,075 B1 * | 6/2010 | Vasudevan | | 323/314 |
| 7,765,418 B2 * | 7/2010 | Mann et al. | | 713/320 |
| 8,014,214 B2 * | 9/2011 | Kang | | 365/189.07 |
| 8,044,647 B2 * | 10/2011 | Kang | | 323/280 |
| 8,253,478 B2 * | 8/2012 | Jung et al. | | 327/540 |
| 8,289,798 B2 * | 10/2012 | Coteus et al. | | 365/226 |
| 2002/0136065 A1 * | 9/2002 | Messager | | 365/189.09 |
| 2012/0020170 A1 | 1/2012 | Nummer et al. | | |

FOREIGN PATENT DOCUMENTS

KR 1020130035242 A 4/2013

OTHER PUBLICATIONS

Understanding DRAM Operation, 1996, International Businees Machines Corp., Applications Note, pp. 3 & 7.*

* cited by examiner

*Primary Examiner* — Thomas J Hiltunen
(74) *Attorney, Agent, or Firm* — William Park & Associates Ltd.

(57) ABSTRACT

Internal voltage generation circuits are provided. The internal voltage generation circuit includes a drive controller and an initialization unit. The drive controller detects a level of an internal voltage signal in response to a reference voltage signal to generate a drive signal and drives the internal voltage signal in response to the drive signal. The initialization unit initializes the drive signal in synchronization with an internal command signal and terminates an initialization of the drive signal during a predetermined period.

15 Claims, 6 Drawing Sheets

INTERNAL VOLTAGE GENERATION CIRCUITS

BACKGROUND

1. Technical Field

Embodiments of the present disclosure relate to semiconductor integrated circuits and, more particularly, to internal voltage generation circuits.

2. Related Art

In general, semiconductor memory devices receive a power supply voltage VDD and a ground voltage VSS from an external system to generate internal voltages used in operations of internal circuits constituting each semiconductor memory device. The internal voltages for operating the internal circuits of the semiconductor memory devices may include a core voltage VCORE supplied to memory core regions; a high voltage VPP used to drive or overdrive word lines; and a back-bias voltage VBB applied to a bulk region (or a substrate) of NMOS transistors in the memory core region.

The core voltage VCORE may be a positive voltage which is lower than the power supply voltage VDD supplied from the external system. Thus, the core voltage VCORE may be generated by lowering the power supply voltage VDD to a certain level. In contrast, the high voltage VPP may be higher than the power supply voltage VDD, and the back-bias voltage VBB may be a negative voltage which is lower than the ground voltage VSS. Thus, charge pump circuits may be required to generate the high voltage VPP and the back-bias voltage VBB.

SUMMARY

Various embodiments are directed to internal voltage generation circuits.

According to various embodiments, an internal voltage generation circuit includes a drive controller and an initialization unit. The drive controller detects a level of an internal voltage signal in response to a reference voltage signal to generate a drive signal and drives the internal voltage signal in response to the drive signal. The initialization unit initializes the drive signal in synchronization with an internal command signal and terminates an initialization of the drive signal during a predetermined period.

According to various embodiments, an internal voltage generation circuit includes a level signal generator suitable for generating a level signal whose logic level is changed in response to an internal command signal; a level signal detector suitable for detecting the level signal to generate a initialization pulse signal; and a drive signal driver suitable for driving a drive signal for generating an internal voltage signal in response to the initialization pulse signal.

According to an embodiment, a system comprises: a processor; a controller suitable for receiving a request and a data from the processor; and a memory unit suitable for receiving the request and the data from the controller, wherein the memory unit includes: a drive controller suitable for detecting a level of an internal voltage signal in response to a reference voltage signal to generate a drive signal and drive the internal voltage signal in response to the drive signal; and an initialization unit suitable for initializing the drive signal in synchronization with an internal command signal and terminate an initialization of the drive signal during a predetermined period.

BRIEF DESCRIPTION OF THE DRAWINGS

Embodiments of the present invention will become more apparent in view of the attached drawings and accompanying detailed descriptions, in which.

DETAILED DESCRIPTION

Various embodiments of the invention will be described hereinafter with reference to the accompanying drawings. However, the embodiments described herein are for illustrative purposes only and are not intended to limit the scope of the invention.

Figure 1:
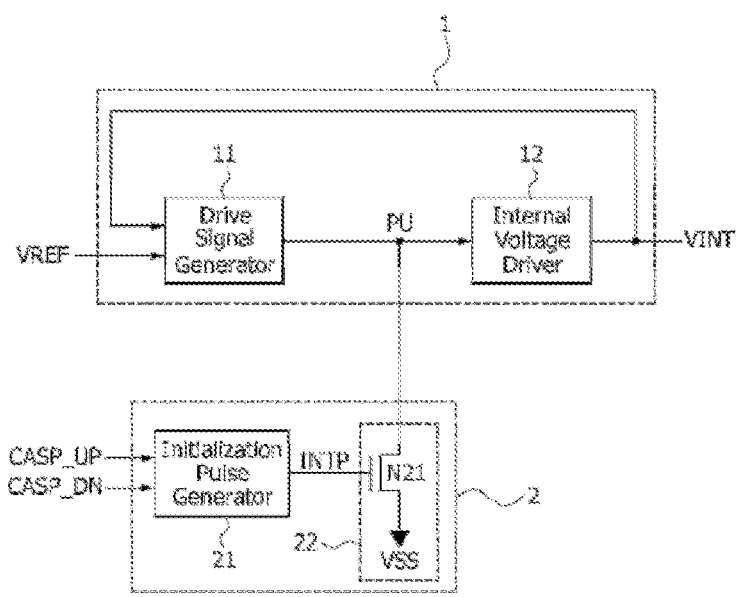
FIG. 1 is a block diagram illustrating an internal voltage generation circuit according to an embodiment of the present invention.

Referring to FIG. 1, an internal voltage generation circuit according to an embodiment of the present invention may include a drive controller 1 and an initialization unit 2. The drive controller 1 may include a drive signal generator 11 and an internal voltage driver 12. The drive signal generator 11 may detect a level of an internal voltage signal VINT in response to a reference voltage signal VREF to generate a drive signal PU. The internal voltage driver 12 may drive the internal voltage signal VINT in response to a power supply voltage VDD when the drive signal PU is enabled to have a logic "low" level. The initialization unit 2 may include an initialization pulse generator 21, a transistor N21 and a drive signal driver 22. The initialization pulse generator 21 may generate an initialization pulse signal INTP in response to an up-command signal CASP_UP and a down-command signal CASP_DN. The drive signal driver 22 may drive the drive signal PU to have a ground voltage VSS if a pulse of the initialization pulse signal INTP is generated. The drive signal driver 22 may be suitable for driving the drive signal PU for generating an internal voltage signal VINT in response to the initialization pulse signal INTP to initialize the drive signal PU.

The up-command signal CASP_UP may include at least one pulse for executing any one among an active operation, a read operation and a write operation of a first memory cell array. That is, the pulse of the up-command signal CASP_UP may be generated to execute any one among the active operation, the read operation and the write operation of the first memory cell array. The down-command signal CASP_DN may include at least one pulse for executing any one among an active operation, a read operation and a write operation of a second memory cell array. That is, the pulse of the down-command signal CASP_DN may be generated to execute any one among the active operation, the read operation and the write operation of the second memory cell array.

Figure 2:
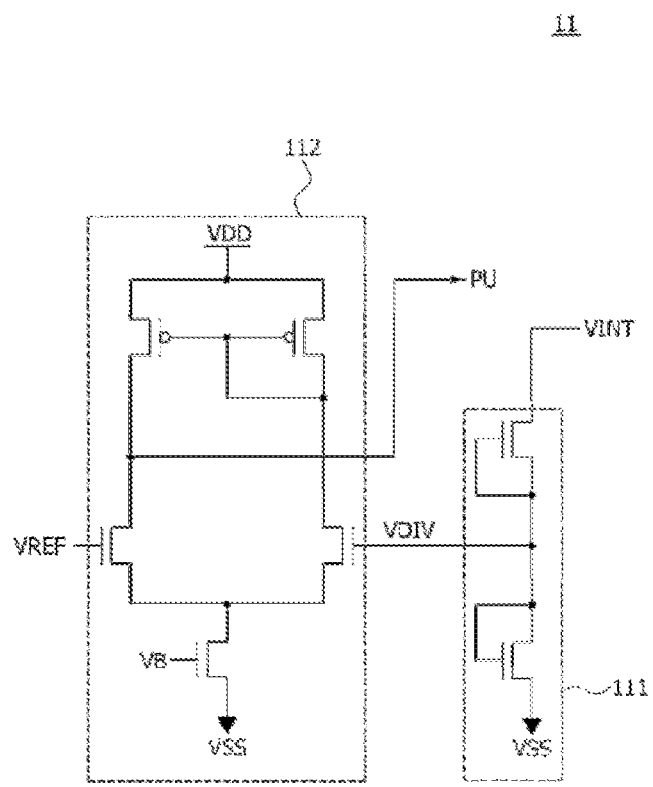
FIG. 2 is a circuit diagram illustrating a drive signal generator included in the internal voltage generation circuit of FIG. 1.

Referring to FIG. 2, the drive signal generator 11 may include a voltage divider 111 and a comparator 112. The voltage divider 111 may divide a level of the internal voltage signal VINT to generate a division voltage signal VDIV. The comparator 112 may receive a power supply voltage VDD and a ground voltage VSS to operate and may be activated in response to a bias voltage signal VB. While being activated, the comparator 112 may compare a level of the division voltage signal VDIV with a level of the reference voltage signal VREF to generate the drive signal PU. The drive signal PU may be enabled to have a logic "low" level when a level of the division voltage signal VDIV is lower than a level of the reference voltage signal VREF.

Figure 3:
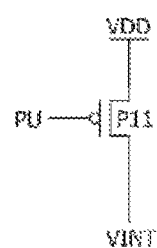
FIG. 3 is a circuit diagram illustrating an internal voltage driver included in the internal voltage generation circuit of FIG. 1.

Referring to FIG. 3, the internal voltage driver 12 may be coupled between a supply terminal of the power supply voltage VDD and a node through which the internal voltage signal VINT is outputted and may be realized using a PMOS transistor P11 which is turned on in response to the drive signal PU. When the drive signal PU is enabled to have a logic "low" level, the PMOS transistor P11 may be turned on to drive the internal voltage signal VINT to have the power supply voltage VDD.

Figure 4:
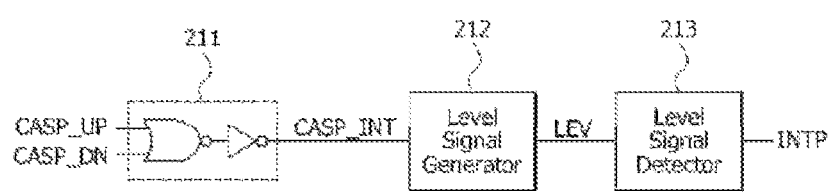
FIG. 4 is a block diagram illustrating an initialization pulse generator included in the internal voltage generation circuit of FIG. 1.
Figure 5:
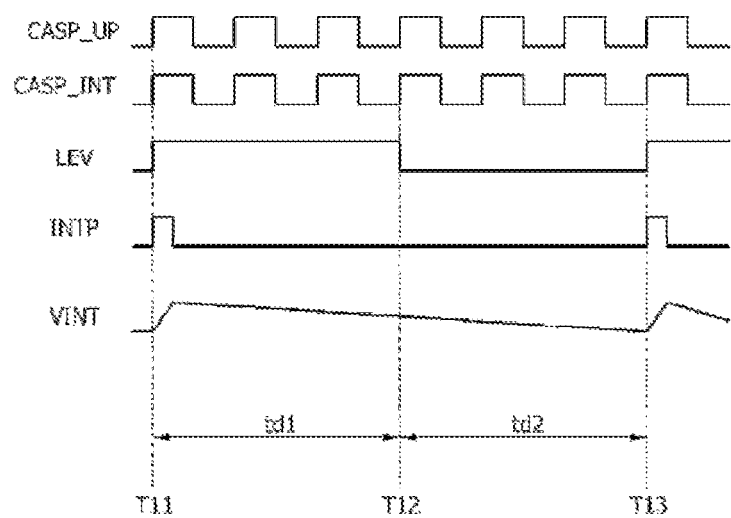
FIG. 5 is a timing diagram illustrating an operation of the internal voltage generation circuit shown in FIG. 1.

Referring to FIG. 4, the initialization pulse generator 21 may include a command synthesizer 211, a level signal generator 212 and a level signal detector 213. The command synthesizer 211 may synthesize the up-command signal CASP_UP and the down-command signal CASP_DN to generate an internal command signal CASP_INT including at least one pulse. The pulse of the internal command signal CASP_INT may be generated in synchronization with the pulse of the up-command signal CASP_UP or the down-command signal CASP_DN. The level signal generator 212 may generate a level signal LEV whose logic level is changed whenever at least one pulse of the internal command signal CASP_INT is created. The level signal detector 213 may detect the level signal LEV to generate the initialization pulse signal INTP. In various embodiments, the pulse of the initialization pulse signal INTP may be generated at a moment that the level signal LEV is changed from a logic "low" level to a logic "high" level. That is, the pulse of the initialization pulse signal INTP may be generated in synchronization with a rising edge of the level signal LEV. Accordingly, the initialization unit 2 may be suitable for initializing the drive signal PU in synchronization with the internal command signal CASP_INT and suitable for terminating an initialization of the drive signal PU synchronized with the internal command signal CASP_INT during a predetermined period from a point of time that the drive signal PU is initialized.

An operation of the internal voltage generation circuit set forth above will be described hereinafter with reference to FIGS. 1 to 5 under the assumption that the pulses of the up-command signal CASP_UP are sequentially inputted to the internal voltage generation circuit.

If the pulses of the up-command signal CASP_UP are sequentially inputted from a point of time "T11", pulses of the internal command signal CASP_INT may also be sequentially generated. At the point of time "T11" that a first pulse of the internal command signal CASP_INT is generated, a level of the level signal LEV may be changed from a logic "low" level to a logic "high" level.

At a point of time "T12" that a first delay time TD1 elapses from the point of time "T11", the level of the level signal LEV may be changed from a logic "high" level to a logic "low" level. At a point of time "T13" that a second delay time TD2 elapses from the point of time "T12", the level of the level signal LEV may be changed from a logic "low" level to a logic "high" level. In an embodiment, each of the first and second delay times TD1 and TD2 may be set to correspond to a period that three pulses of the internal command signal CASP_INT are inputted. That is, each of the first and second delay times TD1 and TD2 may be set to be three times a cycle time of the internal command signal CASP_INT. However, in some embodiments, the first and second delay times TD1 and TD2 may be set such that the first delay time TD1 is different from the second delay time TD2. In various embodiments, the first and second delay times TD1 and TD2 may be set regardless of a cycle time of the internal command signal CASP_INT.

The pulse of the initialization pulse signal INTP may be generated at a rising edge of the level signal LEV. That is, the pulse of the initialization pulse signal INTP may be generated at the points of time "T11" and "T13" that a level of the level signal LEV is changed from a logic "low" level to a logic "high" level. Thus, only at the points of time "T11" and "T13", the drive signal PU may be initialized to have a logic "low" level to drive the internal voltage signal VINT.

Figure 6:
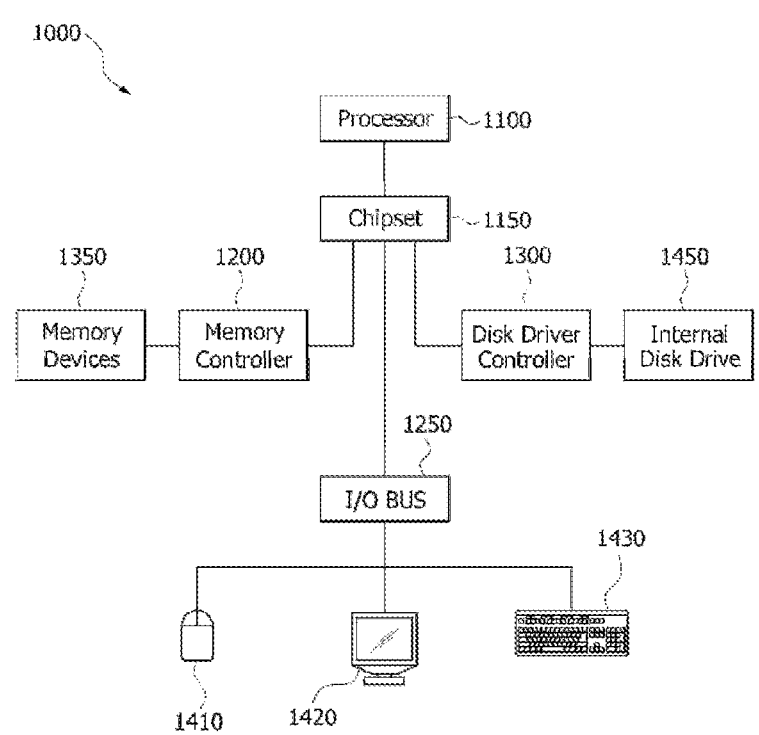
FIG. 6 illustrates a block diagram of a system employing a memory controller circuit in accordance with an embodiment of the invention.

Referring to FIG. 6, a system 1000 may include one or more processors or central processing units ("CPUs") 1100. The processor 1100 may be used individually or in combination with other CPUs.

A chipset 1150 may be operably coupled to the processor 1100. The chipset 1150 is a communication pathway for signals between the processor 1100 and other components of the system 1000, which may include a memory controller 1200, an input/output ("I/O") bus 1250, and a disk drive controller 1300. Depending on the configuration of the system, any one of a number of different signals may be transmitted through the chipset 1150.

The memory controller 1200 may be operably coupled to the chipset 1150. The memory controller 1200 may include at least one memory controller which delays the generation of the address signal, and blocks consecutive accesses, of which the number exceeds the predetermined critical value, to the same word line or the same bit line of a selected memory bank of the memory unit. Thus, the memory controller 1200 can receive a request provided from the processor 1100, through the chipset 1150. The memory controller 1200 may be operably coupled to the one or more memory devices 1350. The memory devices 1350 may include the internal voltage generation circuit described above.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420 and 1430 may include a mouse 1410, a video display 1420 or a keyboard 1430. The I/O bus 1250 may employ any one of a number of communications protocols to communicate with the I/O devices 1410, 1420, and 1430.

The disk driver controller 1300 may also be operably coupled to the chipset 1150. The disk drive controller 1300 may serve as the communication pathway between the chipset 1150 and one or more internal disk drives 1450. The internal disk drive 1450 may facilitate a disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

As described above, in the initialization of the drive signal PU controlling a drive of the internal voltage signal VINT according to the internal command signal CASP_INT, the internal voltage generation circuit according to the embodiments may terminate the initialization operation of the drive signal PU during a predetermined period (e.g., the first delay time TD1 or the second delay time TD2) after initializing the drive signal PU at a point of time that a specific pulse of the internal command signal CASP_INT is generated. This is because the internal voltage signal VINT is overdriven to boost a level of the internal voltage signal VINT if the drive signal PU is initialized whenever the pulses of the internal command signal CASP_INT are generated. Thus, the internal voltage generation circuit according to the embodiments may execute the initialization operation of the drive signal PU at intervals of the predetermined period to stably generate the internal voltage signal without excessive boost of a level of the internal voltage signal.

What is claimed is:

1. An internal voltage generation circuit comprising:
   a drive controller suitable for detecting a level of an internal voltage signal in response to a reference voltage signal to generate a drive signal and driving the internal voltage signal in response to the drive signal; and
   an initialization unit suitable for initializing the drive signal in synchronization with an up-command signal and a down-command signal and terminating an initialization of the drive signal during a predetermined period from a point of time that the drive signal is initialized, wherein the up-command signal includes at least one pulse for executing any one among an active operation, a read operation and a write operation of a first memory cell array and wherein the down-command signal includes at least one pulse for executing any one among an active operation, a read operation and a write operation of a second memory cell array, wherein the initialization unit includes a command synthesizer suitable for synthesizing the up-command signal and the down-command signal to generate an internal command signal and a level signal generator suitable for generating a level signal whose logic level is changed in response to the internal command signal, wherein the logic level of the level signal is changed whenever at least two pulses of the internal command signal is generated.

2. The internal voltage generation circuit of claim 1, wherein the drive controller includes:
   a drive signal generator suitable for detecting a level of the internal voltage signal in response to the reference voltage signal to generate the drive signal; and
   an internal voltage driver suitable for driving the internal voltage signal in response to the drive signal.

3. The internal voltage generation circuit of claim 2, wherein the drive signal generator compares a level of a division voltage signal generated by dividing a level of the internal voltage signal with a level of the reference voltage signal to generate the drive signal.

4. The internal voltage generation circuit of claim 3, wherein the drive signal is enabled when a level of the division voltage signal is lower than a level of the reference voltage signal.

5. The internal voltage generation circuit of claim 4, wherein the internal voltage driver drives the internal voltage signal in response to a power supply voltage when the drive signal is enabled.

6. The internal voltage generation circuit of claim 1, wherein the initialization unit includes:
   an initialization pulse generator suitable for generating an initialization pulse signal in response to the up-command signal and the down-command signal; and
   a drive signal driver suitable for driving the drive signal in response to the initialization pulse signal.

7. The internal voltage generation circuit of claim 6, wherein the initialization pulse generator further includes:
   a level signal detector suitable for detecting the level signal to generate the initialization pulse signal.

8. The internal voltage generation circuit of claim 7, wherein the internal command signal includes a pulse which is generated in synchronization with a pulse of the up-command signal or the down-command signal.

9. The internal voltage generation circuit of claim 7, wherein the initialization pulse signal includes a pulse which is generated when a level of the level signal is changed from a first logic level to a second logic level.

10. An internal voltage generation circuit comprising:
    a level signal generator suitable for generating a level signal whose logic level is changed in response to an internal command signal;
    a level signal detector suitable for detecting the level signal to generate an initialization pulse signal; and
    a drive signal driver suitable for driving a drive signal for generating an internal voltage signal in response to the initialization pulse signal, wherein the internal command signal includes a pulse which is generated in synchronization with a pulse of an up-command signal or a down-command signal, the up-command signal includes at least one pulse for executing any one among an active operation, a read operation and a write operation of a first memory cell array and the down-command signal includes at least one pulse for executing any one among an active operation, a read operation and a write operation of a second memory cell array, wherein the logic level of the level signal is changed whenever at least two pulses of the internal command signal is generated.

11. The internal voltage generation circuit of claim 10, wherein the internal command signal includes at least one pulse for executing any one among an active operation, a read operation and a write operation of a memory cell array.

12. The internal voltage generation circuit of claim 10, wherein the initialization pulse signal includes a pulse which is generated when a level of the level signal is changed from a first logic level to a second logic level.

13. The internal voltage generation circuit of claim 10, wherein the drive signal is enabled when a level of a division voltage signal generated by dividing a level of the internal voltage signal is lower than a level of a reference voltage signal.

14. The internal voltage generation circuit of claim 13, wherein the drive signal is enabled if the drive signal is initialized.

15. The internal voltage generation circuit of claim 13, wherein the internal voltage signal is driven in response to a power supply voltage when the drive signal is enabled.

* * * * *